United States Patent
Yin et al.

(10) Patent No.: US 9,012,274 B2
(45) Date of Patent: Apr. 21, 2015

(54) METHOD OF MANUFACTURING A SEMICONDUCTOR FIN USING SACRIFICIAL LAYER

(75) Inventors: Haizhou Yin, Poughkeepsie, NY (US); Huilong Zhu, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 210 days.

(21) Appl. No.: 13/580,965

(22) PCT Filed: May 14, 2012

(86) PCT No.: PCT/CN2012/000649
§ 371 (c)(1),
(2), (4) Date: Aug. 24, 2012

(87) PCT Pub. No.: WO2013/040845
PCT Pub. Date: Mar. 28, 2013

(65) Prior Publication Data
US 2013/0099361 A1    Apr. 25, 2013

(30) Foreign Application Priority Data
Sep. 20, 2011  (CN) ............ 2011 1 0280628

(51) Int. Cl.
*H01L 21/84* (2006.01)
*H01L 21/20* (2006.01)
*H01L 27/12* (2006.01)
*H01L 29/06* (2006.01)
*H01L 29/66* (2006.01)

(52) U.S. Cl.
CPC ............ *H01L 21/20* (2013.01); *H01L 27/1211* (2013.01); *H01L 29/0657* (2013.01); *H01L 29/66795* (2013.01)

(58) Field of Classification Search
None
See application file for complete search history.

(56) References Cited

U.S. PATENT DOCUMENTS

| 6,706,571 B1 | 3/2004 | Yu et al. |
| 7,265,005 B2 * | 9/2007 | Nowak et al. ............. 438/176 |
| 8,455,364 B2 * | 6/2013 | Kanakasabapathy ......... 438/736 |

(Continued)

FOREIGN PATENT DOCUMENTS

| CN | 101183678 A | 5/2008 |
| CN | 101371336 A | 2/2009 |

*Primary Examiner* — Evan Pert
*Assistant Examiner* — Herve Assouman
(74) *Attorney, Agent, or Firm* — Treasure IP Group, LLC

(57) ABSTRACT

The present invention provides a method for manufacturing a semiconductor structure, comprising the steps of: providing a semiconductor substrate, forming an insulating layer on the semiconductor substrate, and forming a semiconductor base layer on the insulating layer; forming a sacrificial layer and a spacer surrounding the sacrificial layer on the semiconductor base layer, and etching the semiconductor base layer by taking the spacer as a mask to form a semiconductor body; forming an insulating film on sidewalls of the semiconductor body; removing the sacrificial layer and the semiconductor body located under the sacrificial layer to form a first semiconductor fin and a second semiconductor fin. Correspondingly, the present invention further provides a semiconductor structure. In the present invention, an oxide film is formed on the sidewalls of the two semiconductor fins that are far away from each other, while only the sidewalls of the two semiconductor fins that are opposite to each other are exposed, such that conventional operations may be easily performed to the sidewalls opposite to each other in the subsequent process.

8 Claims, 4 Drawing Sheets

(56) References Cited

U.S. PATENT DOCUMENTS

| | | | |
|---|---|---|---|
| 2010/0130011 A1* | 5/2010 | Endoh et al. | 438/689 |
| 2010/0267238 A1* | 10/2010 | Johnson et al. | 438/692 |
| 2011/0027978 A1* | 2/2011 | Hargrove et al. | 438/585 |
| 2013/0049125 A1* | 2/2013 | Zhong et al. | 257/368 |

* cited by examiner

METHOD OF MANUFACTURING A SEMICONDUCTOR FIN USING SACRIFICIAL LAYER

CROSS REFERENCE

This application is a National Phase application of, and claims priority to, PCT Application No. PCT/CN2012/000649, filed on May 14, 2012, entitled 'SEMICONDUCTOR STRUCTURE AND METHOD FOR MANUFACTURING THE SAME', which claimed priority to Chinese Application No. CN 201110280628.8, filed on Sep. 20, 2011. Both the PCT Application and Chinese Application are incorporated herein by reference in their entireties.

FIELD OF THE INVENTION

The present invention relates to the semiconductor technical field, more particularly, to a semiconductor structure and a method for manufacturing the same.

BACKGROUND OF THE INVENTION

In the semiconductor technology, the focus of research is shifted to a three dimensional (3D) device structure, in order to realize a full-depletion device. A 3D structure is constructed by forming a semiconductor fin (for forming a channel) on a silicon on insulator (SOI), forming a channel region at the middle of the semiconductor fin, forming a gate on the sidewalls of the semiconductor fin, and forming source/drain regions at both ends of the semiconductor fin.

Currently, dual fin structures appear in the 3D device structure, namely, two parallel semiconductor fins are formed on the SOI, and the two parallel semiconductor fins are taken as fin channels to form two independent semiconductor devices, wherein respective gates are formed on the sidewalls of the two semiconductor fins that are far away from each other, while the sidewalls of the two semiconductor fins that are opposite to each other are exposed.

If it is desirable to perform a processing to the exposed sidewalls of the two semiconductor fins, the two sidewalls far away from each other of the two semiconductor fins shall be firstly protected by covering with materials such as a photoresist. However, there is certain difficulty in the process of accurately covering the two sidewalls of the two semiconductor fins that are far away from each other because the semiconductor fins generally have a very thin thickness.

SUMMARY OF THE INVENTION

In order to solve the above problem, there is provided in the present invention a semiconductor structure and a method for manufacturing the same, wherein an oxide film is formed on the sidewalls of the two semiconductor fins that are far away from each other, while only the sidewalls of the two semiconductor fins that are opposite to each other are exposed, such that conventional operations may be easily performed to the sidewalls opposite to each other in the subsequent process.

In accordance with a first aspect of the present invention, there is provided a method for manufacturing a semiconductor structure, comprising:
a) providing a semiconductor substrate, forming an insulating layer on the semiconductor substrate, and forming a semiconductor base layer on the insulating layer;
b) forming a sacrificial layer and a spacer surrounding the sacrificial layer on the semiconductor base layer, and etching the semiconductor base layer by taking the spacer as a mask to form a semiconductor body;
c) forming an insulating film on sidewalls of the semiconductor body; and
d) removing the sacrificial layer and the semiconductor body located under the sacrificial layer to form a first semiconductor fin and a second semiconductor fin.

In accordance with another aspect of the present invention, there is further provided a semiconductor structure, comprising a substrate, an insulating layer on the substrate, and semiconductor fins on the insulating layer,
the semiconductor fins include a first semiconductor fin and a second semiconductor fin that are parallel to each other; and an insulating film is formed on outer walls of the first semiconductor fin and the second semiconductor fin, the outer walls thereof being far away from each other.

Wherein the "parallel" means substantially parallel that can be achieved within a tolerance achievable in the semiconductor manufacturing field.

The present invention has the following advantages over the prior art: a semiconductor structure having dual fins is formed, and an oxide film exists on the sidewalls of the two semiconductor fins that are far away from each other, while only the sidewalls of the two semiconductor fins that are opposite to each other are exposed, such that conventional operations may be performed to the sidewalls opposite to each other in the subsequent process. Further, the method provided by the present invention is simple in process and easy to be operated as compared with the method of covering the sidewalls of two fins that are far away from each other by a photoresist in the traditional process.

BRIEF DESCRIPTION OF THE DRAWINGS

Other features, purposes and advantages of the present invention will become more apparent by reading the detailed descriptions of the non-limiting embodiments made with reference to the drawings below.

Figure 1:
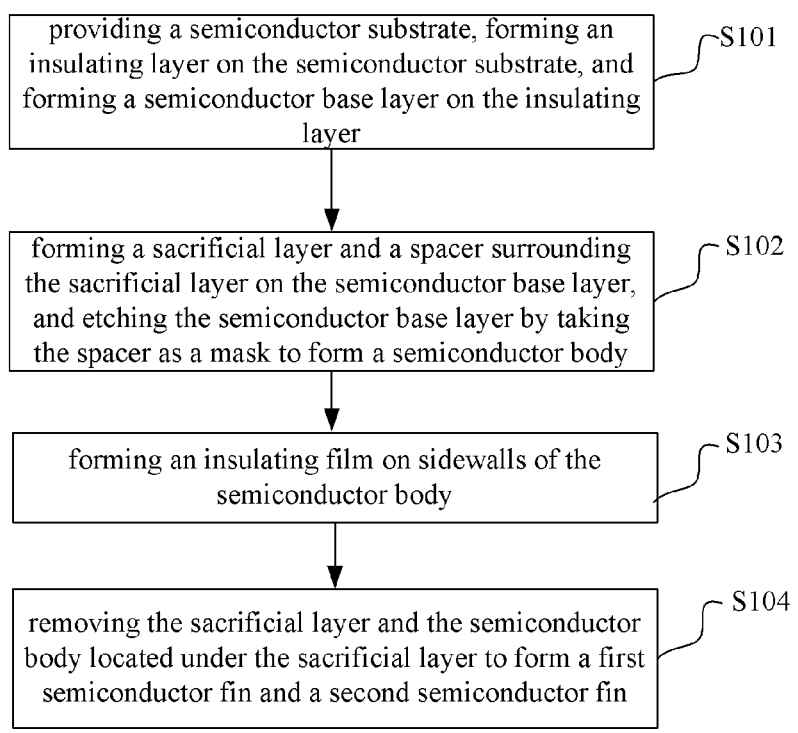
FIG. 1 is a flow chart showing a method for manufacturing the semiconductor structure in accordance with the present invention.

Wherein identical or similar reference signs indicate identical or similar components in the drawings.

DETAILED DESCRIPTION OF THE EMBODIMENTS

In order to make the objects, technical solutions and advantages of the present invention to be clearer, the embodiments of the present invention will be described in detail with reference to the drawings below.

The embodiments of the present invention are described in detail below, and the examples of the embodiments are provided in the drawings, wherein identical or similar reference signs indicate identical or similar components or components having identical or similar functions throughout the drawings. The embodiments described below with reference to the drawings are illustrative, which are used to explain the present invention, but can not be construed as a limit of the present invention.

The disclosure herein provides many different embodiments or examples for realizing different structures of the present invention. In order to simplify the disclosure of the present invention, components and settings of specific examples are described below. Of course, they are only examples and are not intended to limit the present invention. Furthermore, reference numbers and/or letters may be repeated in different examples of the present invention. Such repetitions are for simplification and clearness, which per se do not indicate the relations of the discussed embodiments and/or settings. Moreover, the present invention provides examples of various specific processes and materials, but the applicability of other processes and/or application of other materials may be appreciated by those having ordinary skill in the art. Besides, the following described structure where a first feature is "on" a second feature may either comprise the embodiment where the first feature and the second feature are directly contacted, or may comprise the embodiment where additional features are formed between the first feature and the second feature, and thus the first feature and the second feature may not be directly contacted. The mutual relationships of various structures described in the invention include certain extensions made in accordance with requirements of the process or manufacturing procedure, e.g., the term "vertical" means the difference between an angle between two planes and 90° is within a tolerance allowed by the process or manufacturing procedure.

In accordance with a first aspect of the present invention, there is provided a method for manufacturing a semiconductor structure, as shown in FIG. 1. The method for manufacturing the semiconductor structure as shown in FIG. 1 is described in detail below with reference to FIGS. 2-8, wherein FIGS. 2-8 are diagrammatic cross-sections of the stages of the method for manufacturing the semiconductor structure as shown in FIG. 1 in accordance with an embodiment of the present invention.

First, in step S101, a semiconductor substrate 100 is provided, an insulating layer 101 is formed on the semiconductor substrate 100, and a semiconductor base layer 102 is formed on the insulating layer 101.

Figure 2:
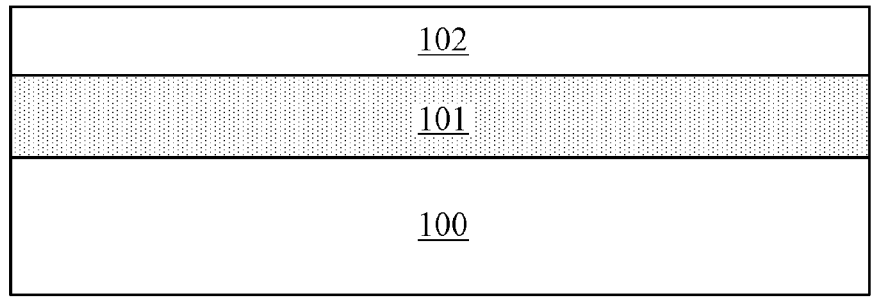
FIGS. 2-8 are diagrammatic cross-sections of the stages for manufacturing the semiconductor structure according to the flow chart shown in FIG. 1 in accordance with a preferred embodiment of the present invention.

Specifically, as shown in FIG. 2, the semiconductor substrate 100 is provided, on which an insulating material and a semiconductor material are sequentially deposited to form the insulating layer 101 and the semiconductor base layer 102. Wherein, in this embodiment, the semiconductor substrate 100 is formed of monocrystalline silicon. While in other embodiments, the semiconductor substrate 100 may further comprise other elemental semiconductors such as germanium (Ge). Or, the semiconductor substrate 100 may further comprise compound semiconductors selected from a group consisting of silicon carbide, gallium arsenide, indium arsenide, and indium phosphide. Typically, the semiconductor substrate 100 may have a thickness of about but not limited to hundreds of micrometers, e.g., a thickness ranging between about 0.5 mm and about 1.5 mm.

The insulating layer 101 is formed of silicon dioxide, silicon oxide, or any other appropriate insulating materials. Typically, the insulating layer 101 may have a thickness ranging between about 200 nm and about 300 nm.

The material for the semiconductor base layer 102 is any one of the semiconductors comprised in the semiconductor substrate 100. In this embodiment, the semiconductor base layer 102 is formed of monocrystalline silicon. While in other embodiments, the semiconductor base layer 102 may further comprise other elemental semiconductors or other compound semiconductors. Wherein the semiconductor base layer 102 has a thickness ranging between about 20 nm and about 100 nm. Preferably, the semiconductor base layer 102 may have a thickness consistent with the height of the semiconductor fins to be formed subsequently.

Then, step S102 is performed, a sacrificial layer 200 and a spacer 201 surrounding the sacrificial layer 200 are formed on the semiconductor base layer 102, and the semiconductor base layer 102 is etched by taking the spacer 201 as a mask to form a semiconductor body 103.

Figure 3:
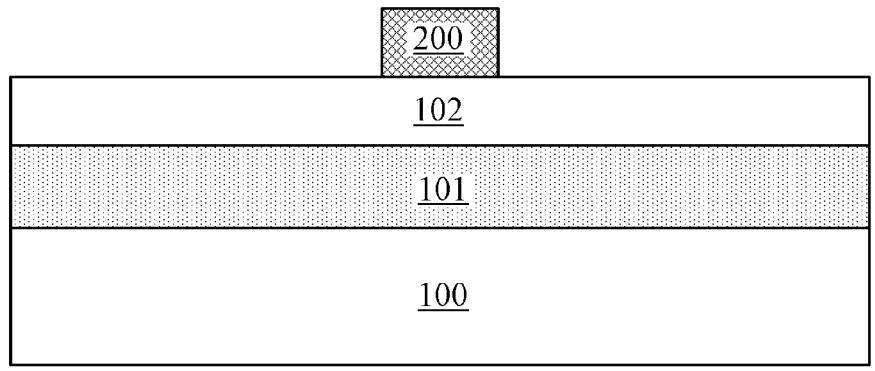

Specifically, as shown in FIG. 3, first a sacrificial layer 200 is formed on the semiconductor base layer 102, on which the area covered by the sacrificial layer 200 will be used to form semiconductor fins. Wherein, the sacrificial layer 200 is formed of a material selected from a group consisting of silicon oxide, silicon nitride and other appropriate materials, with a thickness ranging between about 30 nm and about 80 nm. The method for forming the sacrificial layer is common knowledge known by those having ordinary skill in the art, and no more unnecessary details will be provided here.

Figure 4:
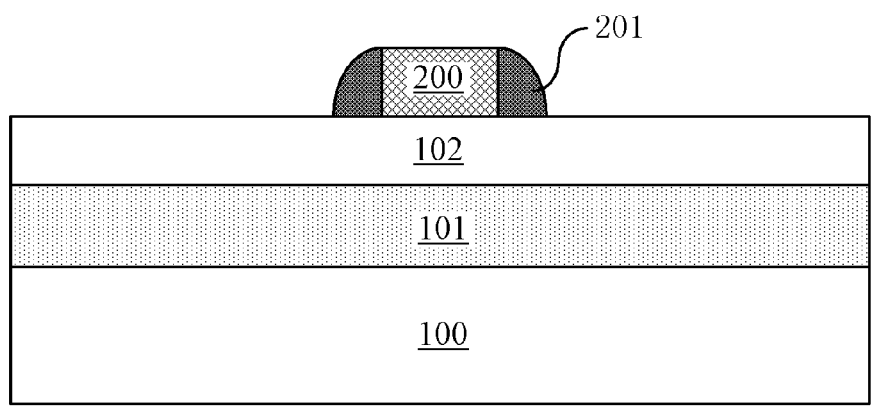

Next, as shown in FIG. 4, a spacer 201 surrounding the sacrificial layer 200 is formed. The material for the spacer 201 may be one of silicon nitride, silicon oxide, silicon oxynitride, and silicon carbide or any combinations thereof. The spacer 201 may have a multi-layer structure and may be formed by a deposition-etching process, with a thickness ranging between about 10 nm and about 100 nm, e.g., 10 nm, 20 nm or 35 nm. Wherein the thickness of the spacer 201 is just equal to the thickness of the semiconductor fins to be formed subsequently.

Figure 5:
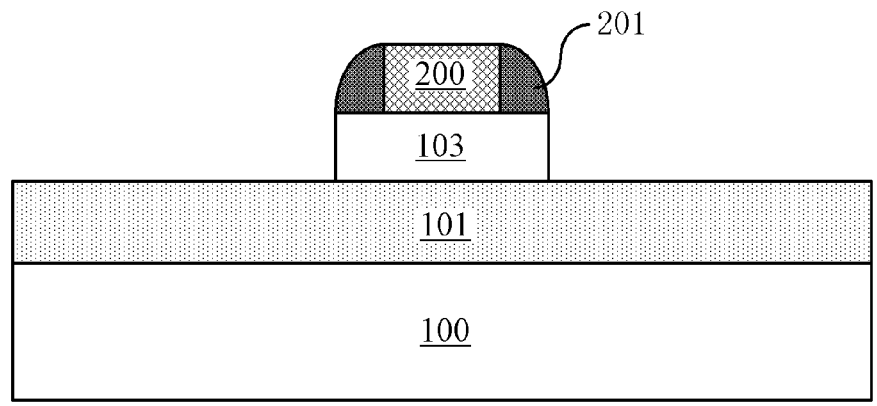

Thereafter, as shown in FIG. 5, the semiconductor base layer 102 is etched by taking the spacer 201 as a mask to form a semiconductor body 103 under the spacer 201 and the sacrificial layer. Wherein appropriate processes such as dry etching and/or wet etching may be used to etch the semiconductor base layer 102.

In step S103, an insulating film 300 is formed on the sidewalls of the semiconductor body 103. The insulating film 300 may be an oxide film, a nitride film, an oxynitride film or other films that may achieve an insulating function. In the embodiment of the present invention, preferably the insulating film 300 is an oxide film.

Figure 6:
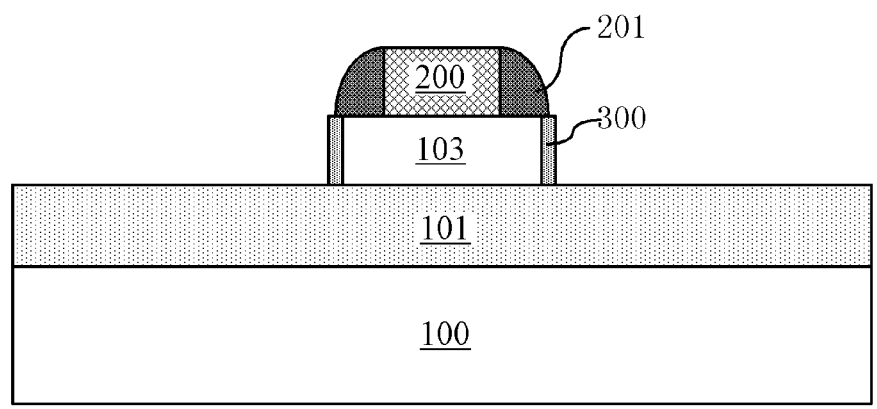

Specifically, as shown in FIG. 6, an oxide film 300 is formed on the sidewalls of the semiconductor body 103 under the spacer 201 by thermal oxidation upon formation of the semiconductor body 103, the oxide film 300 may have a thickness ranging between about 5 nm and about 20 nm. Furthermore, the method for forming the oxide film 300 is not limited to the thermal oxidation, other oxidation methods such as plasma oxidation or high temperature perchloric acid solution may also be adopted. In this embodiment, if the material for the semiconductor body 103 is monocrystalline silicon, then the oxide film 300 is silicon dioxide.

Finally, step S104 is performed to remove the sacrificial layer 200 and the semiconductor body 103 under the sacrificial layer 200, so as to form a first semiconductor fin 210 and a second semiconductor fin 220.

Figure 7:
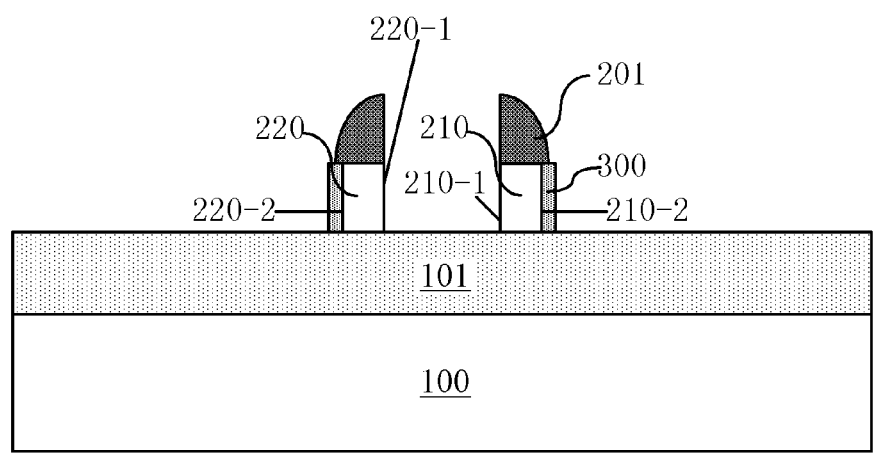
Figure 8:
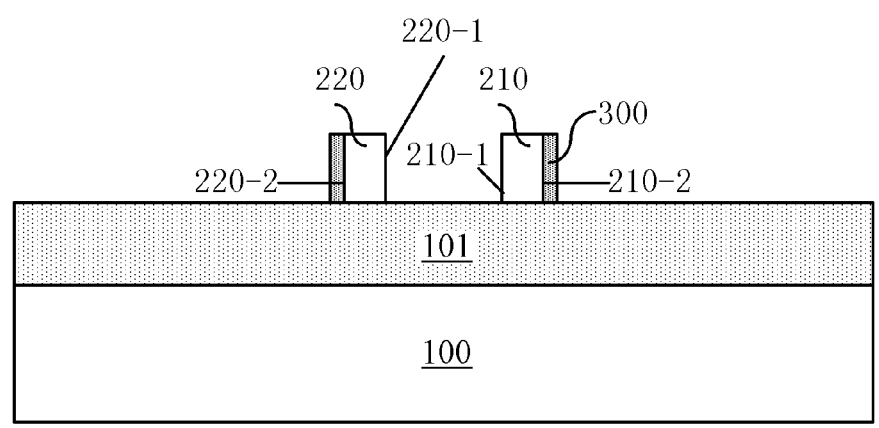

As shown in FIG. 7, first, the sacrificial layer 200 is selectively etched to expose the semiconductor body 103, then the exposed area of the semiconductor body 103 is etched by taking the spacer 201 as a mask and taking the insulating layer 101 as an etching stop layer, to expose the insulating layer 101. Wherein appropriate processes such as dry etching and/or wet etching may be used, and no more unnecessary details will be provided here. After etching, semiconductor fins comprising a first semiconductor fin 210 and a semiconductor fin 220 that are parallel to each other are formed under the spacer 201, each of the fins comprises two sidewalls, that is, the sidewall 210-1 and sidewall 210-2 of the first semiconductor fin 210, and the sidewall 220-1 and sidewall 220-2 of the second semiconductor fin 220, wherein the sidewall 210-1 of the first semiconductor fin and the sidewall 220-1 of the second semiconductor fin are respectively located at the inner side of the first semiconductor fin 210 and the second semiconductor fin 220 and are opposite to each other, while the sidewall 210-2 of the first semiconductor fin and the sidewall 220-2 of the second semiconductor fin are respectively located at the outer side of the first semiconductor fin 210 and the second semiconductor fin 220 and are far away from each other. The first semiconductor fin 210 and/or the second semiconductor fin 220 have a thickness ranging between about 10 nm and about 100 nm and have a height ranging between about 20 nm and about 100 nm. Taking the first semiconductor fin 210 as an example, the thickness refers to the distance between the sidewall 210-1 and the sidewall 210-2 of the first semiconductor fin, and the height refers to the distance between the upper surface of the first semiconductor fin and the insulating layer. Upon formation of the semiconductor fins, the spacer 201 is selectively removed, as shown in FIG. 8.

After performing the above steps, a semiconductor structure with dual fins is formed, and an oxide film exists on the sidewalls of the two semiconductor fins that are far away from each other, while only the sidewalls of the two semiconductor fins that are opposite to each other are exposed, such that conventional operations may be performed to the sidewalls opposite to each other in the subsequent process. Further, the method provided by the present invention is simple in process and easy to be operated as compared with the method of covering the sidewalls of two semiconductor fins that are far away from each other by a photoresist in the traditional process.

In accordance with another aspect of the present invention, there is further provided a semiconductor structure. As shown in FIG. 8, the semiconductor structure comprises a substrate 100, an insulating layer 101 on the substrate 100, and semiconductor fins on the insulating layer 101. Wherein the semiconductor fins comprise a first semiconductor fin 210 and a semiconductor fin 220 that are parallel to each other, and an insulating film 300 is formed on outer walls of the first semiconductor fin 210 and the second semiconductor fin 220, the outer walls thereof are far away from each other.

Specifically, in this embodiment, the semiconductor substrate 100 is monocrystalline silicon. While in other embodiments, the semiconductor 100 may further comprise other elemental semiconductors such as germanium (Ge). Or, the semiconductor substrate 100 may further comprise compound semiconductors selected from a group consisting of silicon carbide, gallium arsenide, indium arsenide, and indium phosphide. Typically, the semiconductor substrate 100 may have a thickness of about but not limited to hundreds of micrometers, e.g., a thickness ranging between about 0.5 mm and about 1.5 mm.

The insulating layer 101 is formed of silicon dioxide, silicon oxide, or any other appropriate insulating materials. Typically, the insulating layer 101 may have a thickness ranging between about 200 nm and about 300 nm.

The material for the first semiconductor fin 210 and the second semiconductor fin 220 is any one of the semiconductors comprised in the semiconductor substrate 100. In this embodiment, the first semiconductor fin 210 and the second semiconductor fin 220 are formed of monocrystalline silicon. In other embodiments, the first semiconductor fin 210 and the second semiconductor fin 220 may further comprise other elemental semiconductors or compound semiconductors. Wherein, each fin has two sidewalls, that is, the sidewall 210-1 and sidewall 210-2 of the first semiconductor fin 210, and the sidewall 220-1 and sidewall 220-2 of the second semiconductor fin 220, wherein the sidewall 210-1 of the first semiconductor fin and the sidewall 220-1 of the second semiconductor fin are respectively located at the inner side of the first semiconductor fin 210 and the second semiconductor fin 220 and are opposite to each other, while the sidewall 210-2 of the first semiconductor fin and the sidewall 220-2 of the second semiconductor fin are respectively located at the outer side of the first semiconductor fin 210 and the second semiconductor fin 220 and are far away from each other. The first semiconductor fin 210 and the second semiconductor fin 220 have a thickness ranging between about 10 nm and about 100 nm and have a height ranging between about 20 nm and about 100 nm. Taking the first semiconductor fin 210 as an example, the thickness refers to the distance between the sidewall 210-1 and the sidewall 210-2 of the first semiconductor fin, and the height refers to the distance between the upper surface of the first semiconductor fin 210 and the insulating layer An insulating film 300 is formed on the sidewall 210-2 of the first semiconductor fin 210 and the sidewall 220-2 of the second semiconductor fin 220 that are far away from each other, the thickness thereof ranges between about 5 nm and about 20 nm. The insulating film 300 may be an oxide film, a nitride film, an oxynitride film or other films that may achieve an insulating function, preferably an oxide film. In this embodiment, if the material for the first semiconductor fin 210 and the second semiconductor fin 220 is monocrystalline silicon, then the oxide film 300 is silicon dioxide.

The semiconductor structure provided by the present invention is dual fin structures, and an oxide film exists on the sidewalls of the two semiconductor fins that are far away from each other, while only the sidewalls opposite to each other between the two semiconductor fins are exposed completely, such that conventional operations may be performed to the sidewalls opposite to each other between the two semiconductor fins in the subsequent process.

Although the illustrative embodiments and their advantages have been described in detail, it shall be appreciated that various changes, substitutions and modifications can be made to these embodiments without departing from the spirit of the invention and the scope defined by the attached claims. As for other examples, it may be appreciated by those having ordinary skill in the art that the sequence of the process steps may be changed while keeping the protection scope of the present invention.

In addition, the present invention is applied to a scope that shall not be limited by the processes, mechanisms, manufacture, material constitutions, measures, methods and steps described in the specific embodiments of the Specification. From the disclosure of the present invention, it may be appreciated by those having ordinary skill in the art that for the processes, mechanisms, manufacture, material constitutions, measures, methods or steps currently existed or will be developed, where they perform substantially the same functions or achieve substantially the same effects as the corresponding embodiments of the present invention, they can be applied in accordance with the present invention. Therefore, the appended claims of the present invention aim to comprise these processes, mechanisms, manufacture, material constitutions, measures, methods or steps within their protection scopes.

What is claimed is:
1. A method for manufacturing a semiconductor structure, comprising:
 a) providing a semiconductor substrate (100), forming an insulating layer (101) on the semiconductor substrate (100), and forming a semiconductor base layer (102) on the insulating layer (101);

b) forming a sacrificial layer (200) and a spacer (201) surrounding the sacrificial layer (200) on the semiconductor base layer (102), and etching the semiconductor base layer (102) by taking the spacer (201) and the sacrificial layer (200) as a mask to form a semiconductor body (103);

c) after etching the semiconductor base layer (102), forming an insulating film (300) on sidewalls of the semiconductor body (103); and d) after forming the insulating film (300), removing the sacrificial layer (200) and the semiconductor body (103) located under the sacrificial layer (200) to form a first semiconductor fin (210) and a second semiconductor fin (220), wherein the first semiconductor fin (210) and the second semiconductor fin (220) respectively have a first sidewall with the insulating film (300) thereon and a second exposed sidewall.

2. The method for manufacturing a semiconductor structure according to claim 1, wherein the insulating film (300) has a thickness ranging between about 5 nm and about 20 nm.

3. The method for manufacturing a semiconductor structure according to claim 1, wherein the insulating film (300) is an oxide film.

4. The method for manufacturing a semiconductor structure according to claim 1, wherein after step d), the method further comprises:

e) removing the spacer (201).

5. The method for manufacturing a semiconductor structure according to claim 1 or 4, wherein the step c) comprises:
performing a thermal oxidation operation to the semiconductor body (103).

6. The method for manufacturing a semiconductor structure according to claim 1, wherein the step d) comprises:
etching the sacrificial layer (200) by taking the spacer (201) as a mask; and
etching the semiconductor body (103) by taking the spacer (201) as a mask and taking the insulating layer (101) as an etching stop layer, to form the first semiconductor fin (210) and the second semiconductor fin (220) under the spacer (201).

7. The method for manufacturing a semiconductor structure according to claim 2, wherein the insulating film (300) is an oxide film.

8. The method for manufacturing a semiconductor structure according to claim 4, wherein the step d) comprises:
etching the sacrificial layer (200) by taking the spacer (201) as a mask; and
etching the semiconductor body (103) by taking the spacer (201) as a mask and taking the insulating layer (101) as an etching stop layer, to form the first semiconductor fin (210) and the second semiconductor fin (220) under the spacer (201).

* * * * *